(12) United States Patent
Lao et al.

(10) Patent No.: US 12,513,924 B2
(45) Date of Patent: Dec. 30, 2025

(54) SEMICONDUCTOR DEVICE

(71) Applicant: Vanguard International Semiconductor Corporation, Hsinchu (TW)

(72) Inventors: Chung-Ren Lao, Taichung (TW); Hsiao-Ying Yang, Taichung (TW); Hsing-Chao Liu, Zhudong Township (TW); Ching-Chung Chen, Magong (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 508 days.

(21) Appl. No.: 17/973,250

(22) Filed: Oct. 25, 2022

(65) Prior Publication Data
US 2024/0136447 A1 Apr. 25, 2024
US 2024/0234587 A9 Jul. 11, 2024

(51) Int. Cl.
*H10D 8/60* (2025.01)
*H10D 64/64* (2025.01)

(52) U.S. Cl.
CPC ............. *H10D 8/60* (2025.01); *H10D 64/64* (2025.01)

(58) Field of Classification Search
CPC ........ H10D 8/60; H10D 64/64; H10D 62/115; H10D 62/126; H10D 62/106
USPC ........................................ 257/471
See application file for complete search history.

(56) References Cited

U.S. PATENT DOCUMENTS

| 6,440,828 B1* | 8/2002 | Sato | H01L 21/76897 257/E21.507 |
| 10,373,965 B2* | 8/2019 | Seo | G11C 17/18 |
| 11,355,490 B2* | 6/2022 | Lin | H02H 9/046 |
| 2017/0365595 A1* | 12/2017 | He | H10D 62/109 |

OTHER PUBLICATIONS

Taiwanese Office Action and Search Report for Taiwanese Application No. 111133101, dated May 3, 2023.

* cited by examiner

*Primary Examiner* — Monica D Harrison
(74) *Attorney, Agent, or Firm* — Birch, Stewart, Kolasch & Birch, LLP

(57) ABSTRACT

A semiconductor device is provided. The semiconductor device includes a semiconductor substrate, a first deep well region, at least two second well regions, at least one isolation structure and an implantation region. The first deep well region is disposed in the semiconductor substrate, wherein the first deep well region has a first conductivity type. The second well regions are disposed on the first deep well region, wherein the second well regions have a second conductivity type. The isolation structure covers a portion of the first deep well region and surrounds at least a portion of the second well regions. The implantation region is located under a top surface of the semiconductor substrate, wherein the implantation region has a discontinuous portion, and the discontinuous portion partially overlaps the first deep well region.

19 Claims, 3 Drawing Sheets

SEMICONDUCTOR DEVICE

BACKGROUND OF THE INVENTION

Field of the Invention

The disclosure relates to a semiconductor device, and, in particular, to a Schottky barrier diode.

Description of the Related Art

A Schottky barrier diode is a semiconductor device that has a metal-semiconductor junction. A metal contacting a lightly doped semiconductor material may form a contact structure similar to a P-N junction (a Schottky contact), which may be used to fabricate a Schottky barrier diode. When the Schottky barrier diode is forward-biased (i.e. a positive voltage is applied to the anode and a negative voltage is applied to the cathode), the carriers can flow through the Schottky barrier diode. When the Schottky barrier diode is reverse-biased (i.e. a negative voltage is applied to the anode and a positive voltage is applied to the cathode), the carriers cannot flow through the Schottky barrier diode. Thus, the Schottky barrier diode has unidirectional conductivity like a conventional diode with a P-N junction. In addition, since the Schottky barrier diode allows single carrier movement, a relatively low threshold voltage under forward-bias and a fast switching speed during switching of forward and reverse-biases can be achieved. In fact, the Schottky barrier diode is not an ideal device and will flow a small amount of reverse leakage current. Reverse leakage current can affect the performance of the circuit and reduce the efficiency of the circuit. In order to reduce the reverse leakage current, argon ions are implanted in the anode region, but this will reduce the on-state current of the Schottky barrier diode.

Therefore, a novel Schottky barrier diode having a reduced reverse leakage current and maintaining its on-state current is desired.

BRIEF SUMMARY OF THE INVENTION

An embodiment of the disclosure provides a semiconductor device. The semiconductor device includes a semiconductor substrate, a first deep well region, at least two second well regions, at least one isolation structure and an implantation region. The first deep well region is disposed in the semiconductor substrate, wherein the first deep well region has a first conductivity type. The second well regions are disposed on the first deep well region, wherein the second well regions have a second conductivity type. The isolation structure covers a portion of the first deep well region and surrounds at least a portion of the second well regions. The implantation region is located under a top surface of the semiconductor substrate, wherein the implantation region has a discontinuous portion, and the discontinuous portion partially overlaps the first deep well region.

BRIEF DESCRIPTION OF THE DRAWINGS

The disclosure can be more fully understood by reading the subsequent detailed description and examples with references made to the accompanying drawings, wherein.

DETAILED DESCRIPTION OF THE INVENTION

Figure 1:
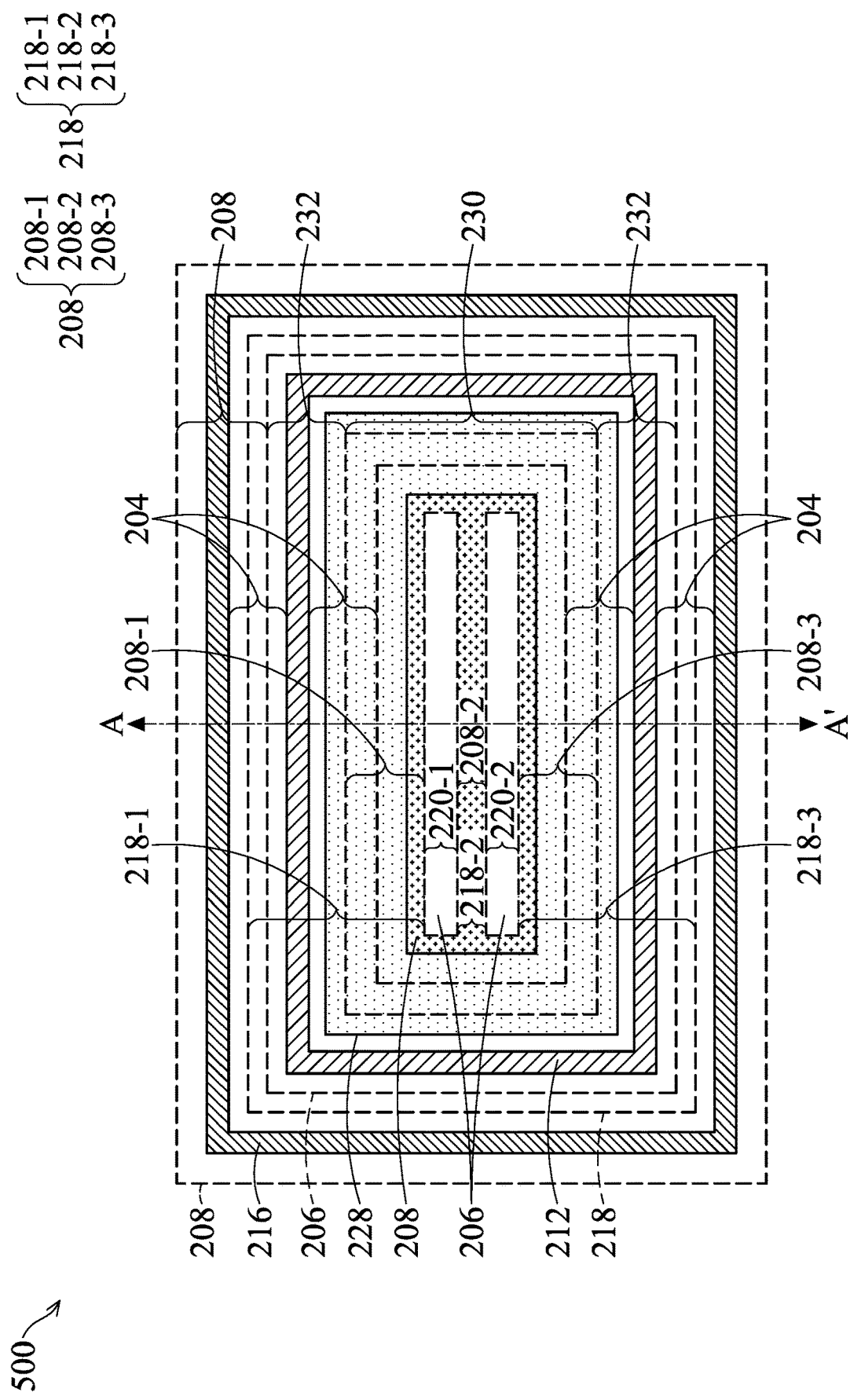
FIG. 1 is a schematic top view of a semiconductor device in accordance with some embodiments of the disclosure.

The following description is made for the purpose of illustrating the general principles of the invention and should not be taken in a limiting sense. The scope of the invention is best determined by reference to the appended claims.

The inventive concept is described fully hereinafter with reference to the accompanying drawings, in which exemplary embodiments of the inventive concept are shown. The advantages and features of the inventive concept and methods of achieving them will be apparent from the following exemplary embodiments that are described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. Also, the drawings as illustrated are only schematic and are non-limiting. In the drawings, the size of some of the elements may be exaggerated for illustrative purposes and not drawn to scale. The dimensions and the relative dimensions do not correspond to actual dimensions in the practice of the invention.

Embodiments of the invention provide a semiconductor device, such as a Schottky barrier diode. An implantation region partially covering the anode region is disposed in the semiconductor device. The implantation region is located only in a second well region for clamping the off-state leakage current. In addition, there is no implantation region disposed in a first deep well region for conducting the on-state current. Therefore, the reduction of the on-state current of the Schottky barrier diode can be avoided and the problem of the off-state leakage current can be improved.

Figure 2:
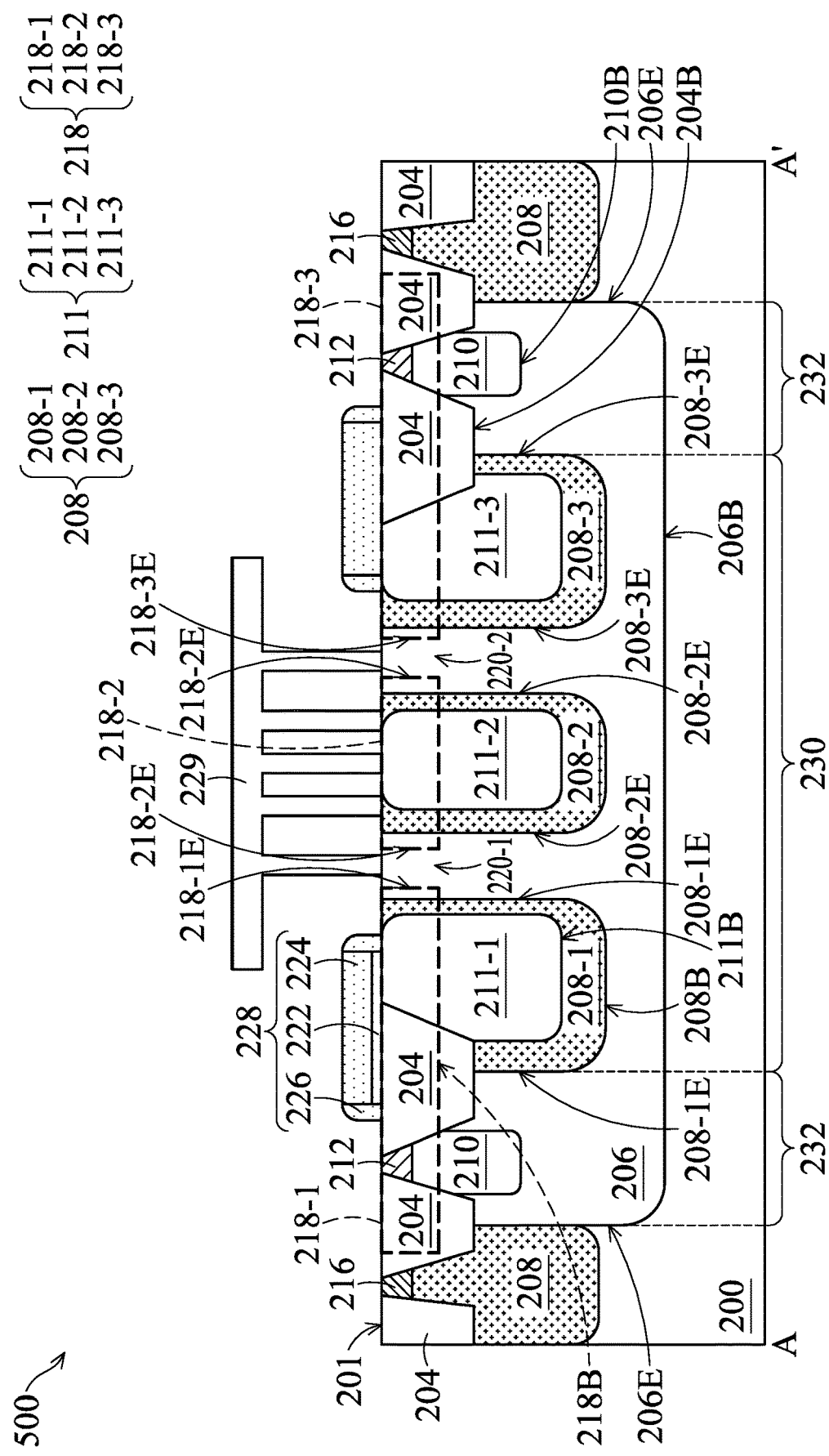
FIG. 2 is a schematic cross-sectional view along the line A-A' of the semiconductor device of FIG. 1 in accordance with some embodiments of the disclosure.

FIG. 1 is a schematic top view of a semiconductor device 500 in accordance with some embodiments of the disclosure. FIG. 2 is a schematic cross-sectional view along the line A-A' of the semiconductor device 500 of FIG. 1 in accordance with some embodiments of the disclosure. FIG. 1 only shows some of the features for illustration, and the remaining features may be shown in the cross-sectional view shown in FIG. 2. In some embodiments, the semiconductor device 500 includes a Schottky barrier diode. As shown in FIGS. 1 and 2, in some embodiments, the semiconductor device 500 includes a semiconductor substrate 200, a first deep well region 206, second well regions 208, an isolation structure 204 and an implantation region 218.

In some embodiments, the semiconductor substrate 200 includes an elementary semiconductor, such as silicon (Si), germanium (Ge), etc.; a compound semiconductor, such as gallium nitride (GaN), silicon carbide (SiC), gallium arsenide (GaAs), gallium phosphide (GaP), indium phosphide (InP), indium arsenide (InAs), indium antimonide (InSb), etc.; an alloy semiconductor, such as SiGe alloy, GaAsP alloy, AlInAs alloy, AlGaAs alloy, GaInAs alloy, GaInP alloy, GaInAsP alloy, or a combination thereof. In addition, the semiconductor substrate 200 may also include a silicon-on-insulator (SOI). In some embodiments, the conductivity type of the semiconductor substrate 200 may be P-type or N-type depending on design requirements.

As shown in FIGS. 1 and 2, the first deep well region 206 and the second well regions 208 are disposed in the semiconductor substrate 200. The second well regions 208 are respectively disposed on the first deep well region 206 and outside the first deep well region 206. The second well region 208 disposed on the first deep well region 206 includes second well region portions 208-1, 208-2 and 208-3. In the top view as shown in FIG. 1, a boundary 206E of the first deep well region 206 surrounds the second well region 208 disposed within the first deep well region 206. In the cross-sectional view shown in FIG. 2, a bottom surface 206B of the first deep well region 206 is located below a bottom surface 208B of the second well region 208. In other words, the first deep well region 206 surrounds the second well region 208 disposed on the first deep well region 206.

In some embodiments, the second well region 208 surrounded by the first deep well region 206 has a shape in which ring portions are adjacently arranged in a top view shown in FIG. 1. In some embodiments, the second well region 208 surrounded by the first deep well region 206 includes the finger-shaped second well region portions 208-1, 208-2 and 208-3 that are substantially parallel to and spaced apart from each other in the cross-sectional view shown in FIG. 2. For example, the second well region portions 208-1, 208-2 and 208-3 collectively have a double-D shape in the top view as shown in FIG. 1. In some embodiments, the second well region 208 may not include the second well region portion 208-2 between the second well region portions 208-1 and 208-3, and therefore has a ring shape in the top view as shown in FIG. 1.

As shown in FIGS. 1 and 2, the second well region 208 disposed outside the first deep well region 206 surrounds the first deep well region 206. In addition, the second well region 208 disposed outside the boundary 206E of the first deep well region 206 is adjacent to the first deep well region 206. In some embodiments, the semiconductor device 500 further includes a pick-up doped region 216 disposed on the second well region 208 outside the boundary 206E of the first deep well region 206.

In some embodiments, the first deep well region 206 has a first conductivity type. In some embodiments, the second well region 208 and the pick-up doped region 216 have a second conductivity type opposite to the first conductivity type. For example, when the first deep well region 206 is, for example, a deep N-type well (DNW) region, the second well region 208 is, for example, a P-type well region (such as a high-voltage P-type well (HVPW) region), and the pick-up doped region 216 is, for example, a P-type pick-up doped region. However, the present invention is not limited to the disclosed embodiment, and those skilled in the art can adjust it according to actual needs. In some embodiments, the doping concentration of the pick-up doped region 216 is greater than the doping concentration of the second well region 208, and the doping concentration of the second well region 208 is greater than the doping concentration of the semiconductor substrate 200. In some embodiments, the doping concentration of the first deep well region 206 is between about 1E12 atoms/cm$^2$ to 1E13 atoms/cm$^2$. The doping concentration of the second well region 208 is between about 1E12 atoms/cm$^2$ to 1E13 atoms/cm$^2$.

In some embodiments, when the semiconductor device 500 is forward-biased, the on-state current flows mainly through the first deep well region 206 in an anode region 230. In some embodiments, when the semiconductor device 500 is reverse-biased, the first deep well region 206 between the second well region portions 208-1, 208-2 and 208-3 in the anode region 230 will create a depletion region, which can cause a pinch-off effect for the off-state leakage current (clamping the off-state leakage current). In some embodiments, the semiconductor substrate 200 is electrically connected to the bulk terminal of the resulting semiconductor device 500 through the second well region 208 outside the first deep well region 206 and the pick-up doped region 216 on the second well region 208.

As shown in FIGS. 1 and 2, the semiconductor device 500 further includes a third well region 210 disposed in the semiconductor substrate 200 and a pick-up doped region 212 disposed on the third well region 210. The third well region 210 and the pick-up doped region 212 are disposed on the first deep well region 206. The third well region 210 and the pick-up doped region 212 are close to the boundary 206E of the first deep well region 206 and are disposed on an opposite side of the isolation structure 204 from the second well region portions 208-1 and 208-3. The third well region 210 and the pick-up doped region 212 are also respectively disposed on an opposite side of the isolation structure 204 on the boundary 206E of the first deep well region 206 from the second well region 208, which is disposed outside the boundary 206E of the first deep well region 206. As shown in FIG. 2, a bottom surface 210B of the third well region 210 is located above the bottom surface 206B of the first deep well region 206 and the bottom surface 208B of the second well region 208. As shown in FIGS. 1 and 2, the third well region 210 and the pick-up doped region 212 directly above the third well region 210 surround the second well region 208 on the first deep well region 206. In some embodiments, the third well region 210 and the pick-up doped region 212 have a first conductivity type. For example, when the first deep well region 206 is, for example, a deep N-type well (DNW) region, the third well region 210 is, for example, an N-type well region (such as a low-voltage N-type well (LVNW) region), and the pick-up doped region 212 is, for example, an N-type pick-up doped region. However, the invention is not limited to the disclosed embodiment, and those skilled in the art can adjust it according to actual needs. In some embodiments, the doping concentration of the pick-up doped region 212 is greater than the doping concentration of the third well region 210, and the doping concentration of the third well region 210 is greater than the doping concentration of the first deep well region 206. The first deep well region 206 is electrically connected to a cathode region 232 of the resulting semiconductor device 500 through the third well region 210 and the pick-up doped region 212 on the third well region 210. In some embodiments, the doping concentration of the third well region 210 is between about 1E13 atoms/cm$^2$ and 1E14 atoms/cm$^2$. The doping concentration of the pick-up doped region 212 is between about 1E15 atoms/cm$^2$ and 1E16 atoms/cm$^2$.

As shown in FIGS. 1 and 2, in one embodiment, the semiconductor device 500 further includes a fourth well region 211 in the semiconductor substrate 200. The fourth well region 211 is disposed on the second well region 208 and includes fourth well region portions 211-1, 211-2 and 211-3. The fourth well region portions 211-1, 211-2 and 211-3 are respectively located on the second well region portions 208-1, 208-2 and 208-3, and are respectively surrounded by the second well region portions 208-1, 208-2 and 208-3. As shown in FIG. 2, a bottom surface 211B of the fourth well region 211 is located above the bottom surface 208B of the second well region 208. In some embodiments, the fourth well region 211 has the second conductivity type. For example, when the first deep well region 206 is, for example, a deep N-type well (DNW) region, the fourth well region 211 is, for example, a P-type well region (e.g., a low-voltage P-type well (LVPW) region). However, the invention is not limited to the disclosed embodiment, and those skilled in the art can adjust it according to actual needs. In some embodiments, the doping concentration of the fourth well region 211 is greater than the doping concentration of the second well region 208 and less than the doping concentration of the pick-up doped region 216. The second well region 208 is electrically connected to the anode region 230 of the resulting semiconductor device 500 through the fourth well region 211 on the second well region 208. In some embodiments, the doping concentration of the fourth well region 211 is between about 1E13 atoms/cm$^2$ and 1E14 atoms/cm$^2$.

In some embodiments, multiple ion implantation processes may be used to implant dopants of the first conductivity type and the second conductivity type into the semiconductor substrate 200 to form the first deep well region 206, the second well regions 208, the third well region 210, the fourth well region 211, and the pick-up doped regions 212 and 216, respectively. In some embodiments, the dopant of the first conductivity type is, for example, an N-type dopant, which may include phosphorus (P), arsenic (As), nitrogen (N), antimony (Sb), or a combination thereof. In some embodiments, dopants of the second conductivity type, such as P-type dopants, may include boron (B), gallium (Ga), aluminum (Al), indium (In), boron trifluoride ions ($BF^{3+}$), or a combination thereof.

As shown in FIGS. 1 and 2, isolation structures 204 are disposed on the semiconductor substrate 200 in the first deep well region 206, on the boundary 206E of the first deep well region 206 and in the second well region 208 outside the first deep well region 206. In the cross-sectional view shown in FIG. 2, the isolation structure 204 in the first deep well region 206 surrounds the second well region portions 208-1, 208-2 and 208-3, and partially overlaps the second well region portions 208-1 and 208-3, respectively. In some embodiments, the bottom surface 206B of the first deep well region 206 and the bottom surface 208B of the second well region 208 are located below bottom surfaces 204B of the isolation structures 204. As shown in FIGS. 1 and 2, the isolation structures 204 define the formation positions of the anode region 230 and the cathode region 232 of the resulting semiconductor device 500. In some embodiments, any number of isolation structures 204 may be disposed on the semiconductor substrate 200 according to design requirements. In some embodiments, the isolation structures 204 are field oxide (FOX) layers formed by a local oxidation of silicon (LOCOS) process, shallow trench isolation (STI) structures formed by a deposition process, or other suitable isolation structures. In some embodiments, the isolation structures 204 are formed by a thermal oxidation process, including a dry oxidation process, a wet oxidation process, or other suitable thermal oxidation processes.

As shown in FIGS. 1 and 2, the implantation region 218 is disposed (located) under the surface of the semiconductor substrate 200 and located in the first deep well region 206 and the second well region 208. In some embodiments, a vertical projection area of the implantation region 218 substantially overlaps a vertical projection area of the second well region 208 on the first deep well region 206 as shown in FIG. 1. As shown in FIGS. 1 and 2, the implantation region 218 has a shape of a ring or a shape in which ring-shaped areas are arranged adjacently in the top view shown in FIG. 1, for example, a double-D shape. In some embodiments, the implantation region 218 includes finger-shaped implantation region portions 218-1, 218-2 and 218-3 that are substantially parallel to and spaced apart from each other in the cross-sectional view shown in FIG. 2. In addition, the implantation region portions 218-1, 218-2 and 218-3 are arranged corresponding to the second well region portions 208-1, 208-2, and 208-3. For example, the implantation region portion 218-1 is disposed corresponding to the second well region portion 208-1 and may extend to the isolation structure 204 adjacent to the second well region portion 208-1. In some embodiments, a boundary 208-1E of the second well region portion 208-1, a boundary 208-2E of the second well region portion 208-2, and a boundary 208-3E of the second well region portion 208-3 are located corresponding to a boundary 218-1E of the implantation region portion 218-1, a boundary 218-2E of the implantation region portion 218-2 and a boundary 218-3E of the implantation region portion 218-3, respectively. Those skilled in the art can adjust the relative positions between the boundaries 208-1E, 208-2E and 208-3E of the second well region and the boundaries 218-1E, 218-2E and 218-3E of the implantation region, but the disclosure is not limited to the disclosed embodiments.

As shown in FIGS. 1 and 2, the implantation region 218 has discontinuous portions 220-1 and 220-2. The first deep well region 206 partially overlaps the discontinuous portions 220-1 and 220-2. For example, the discontinuous portion 220-1 of the implantation region 218 is located in the first deep well region 206 between the second well region portions 208-1 and 208-2 of the second well region 208. The discontinuous portion 220-2 of the implantation region 218 is located in the first deep well region 206 between the second well region portions 208-2 and 208-3 of the second well region 208. In some embodiments, the discontinuous portions 220-1 and 220-2 of the implantation region 218 fully overlap at least a portion of the first deep well region 206 surrounded by the second well region 208. Alternatively, a portion of the first deep well region 206 surrounded by the second well region 208 may partially overlap the discontinuous portions 220-1 and 220-2 of the implantation region 218. In some embodiments, the discontinuous portions 220-1 and 220-2 of the implantation region 218 do not overlap the second well portions 208-1, 208-2 and 208-3 of the second well region 208 at all. As shown in FIG. 2, a bottom surface 218B of the implantation region 218 is above the bottom surface 204B of the isolation structure 204. In some embodiments, an ion implantation process may be used to implant argon ions, silicon ions, germanium ions, fluoride ions, nitrogen ions, selenium ions, sulfide ions, or a combination thereof into a region of the semiconductor substrate 200 close to the top surface 201 to form the implantation region 218 and convert the material of the semiconductor substrate 200 in the implantation region 218 into an amorphous semiconductor material, such as amorphous silicon (a-Si). Therefore, the implantation region 218 can also serve as an amorphous semiconductor material region 218. The above-mentioned amorphous semiconductor material has a higher resistance to form a Schottky energy barrier, which can reduce the current flowing through the anode region 230. In some embodiments, the doping concentration of the implantation regions 218 is between about 1E14 atoms/cm$^2$ and 1E15 atoms/cm$^2$.

As shown in FIGS. 1 and 2, the semiconductor device 500 further includes a gate structure 228, which is disposed on the semiconductor substrate 200 in the first deep well region 206 and extends to cover the isolation structure 204 and the adjacent second well region 208. In the top view as shown in FIG. 1, the gate structure 228 surrounds the second well region 208 and partially overlaps the isolation structure 204, which is disposed within the first deep well region 206 and surrounding the second well region 208, and the adjacent second well region 208. In some embodiments, the gate structure 228 includes a gate dielectric layer 222 disposed on the semiconductor substrate 200, a gate electrode layer 224 disposed over the gate dielectric layer 222, and gate spacers 226 disposed on sidewalls of the gate dielectric layer 222 and the gate electrode layer 224. The gate structure 228 can be electrically connected to the anode region 230 of the semiconductor device, and has a function of distributing the electric field when the semiconductor device 500 is reverse-biased. Therefore, the breakdown performance of the semiconductor device 500 under reverse-bias can be improved.

In some embodiments, the gate dielectric layer 222 includes silicon oxide, silicon nitride, silicon oxynitride, high-k materials, other suitable dielectric materials, and/or a combination thereof. Examples of high-k dielectric material include HfO2, HfSiO, HfSiON, HfTaO, HfTiO, HfZrO, zirconium oxide, aluminum oxide, hafnium dioxide-alumina (HfO2-Al2O3) alloy, and/or a combination thereof or similar materials. In some embodiments, the gate dielectric layer 222 may be formed on the semiconductor substrate 200 using an oxidation process, a deposition process, or other suitable process.

In some embodiments, the gate electrode layer 224 includes polysilicon, amorphous silicon, metals (such as tungsten, titanium, aluminum, copper, molybdenum, nickel, platinum, other suitable metals, or a combination thereof), metal alloys, metal nitrides (such as tungsten nitride, molybdenum nitride, titanium nitride, tantalum nitride, other suitable metal nitrides, or a combination thereof), metal oxides (ruthenium oxide, indium tin oxide, other suitable metal oxides, or a combination thereof), other suitable materials, or a combination thereof. In some embodiments, the gate electrode layer 224 may be implanted with dopants by in-situ doping.

In some embodiments, the gate spacers 226 include silicon oxide, silicon nitride, silicon oxynitride, low-k materials, other suitable dielectric materials, and/or or a combination thereof. In some embodiments, the gate spacers 226 may be formed on the sidewalls of gate dielectric layer 222 and gate electrode layer 224 using an oxidation process, a deposition process, or other suitable process.

As shown in FIGS. 1 and 2, the semiconductor device 500 further includes a conductive feature 229, which is disposed on the semiconductor substrate 200 and in contact with (physically contacts) the second well region 208 on the first deep well region 206 and a portion of the first deep well region 206 surrounded by the second well region 208. In addition, the conductive feature 229 is in contact with the discontinuous portions 220-1 and 220-2 of the implantation region 218 in one embodiment. In one embodiment, the conductive feature 229 is in contact with the second well portion 208-2 of the second well region 208, the first deep well region 206 between the second well region portions 208-1 and 208-2 and the first deep well region 206 between the second well region portions 208-2 and 208-3. In some embodiments, the conductive feature 229 is electrically connected to the gate structure 228. In some embodiments, the conductive feature 229 may serve as the anode electrode of the semiconductor device 500. The conductive feature 229 may include a metal (such as nickel (Ni), cobalt (Co), platinum (Pt), titanium (Ti), tungsten (W), aluminum (Al), a combination thereof, or similar materials) to form a metal silicide with the semiconductor substrate 200. In some embodiments, the conductive feature 229 may also include doped polysilicon. In some embodiments, the conductive features 229 may be formed using a deposition process (such as physical vapor deposition (PVD), atomic layer deposition (ALD), sputtering, or a combination thereof) followed by a patterning process.

In some embodiments, the method for forming the semiconductor device 500 includes providing the semiconductor substrate 200 and then forming the isolation structures 204 in the semiconductor substrate 200. Next, the first deep well region 206 is formed in the semiconductor substrate 200. Next, the second well region 208 is formed on the first deep well region 206. Next, the fourth well region 211 is formed on the second well region 208. Next, the third well region 210 is formed on the first deep well region 206. Next, the gate structure 228 is formed on the semiconductor substrate 200 in the first deep well region 206. Next, the pick-up doped region 212 is formed on the first deep well region 206. Next, the implantation region 218 is formed on the surface of the semiconductor substrate 200 and in the first deep well region 206 and the second well region 208. Next, the conductive feature 229 is formed on the semiconductor substrate 200. Finally, the semiconductor device 500 in accordance with some embodiments of the disclosure is formed.

As shown in FIGS. 1 and 2, the second well region 208 and the portions of the first deep well region 206 between the second well region portions 208-1, 208-2 and 208-3 serve as the anode region 230 of the semiconductor device 500, for example, a Schottky barrier diode. In other words, in the top view as shown in FIG. 1, the second well region 208 and the portions of the first deep well region 206 surrounded by the second well region 208 serve as the anode region 230 of the semiconductor device 500, for example, a Schottky barrier diode. In addition, the portions of the first deep well region 206 and the above third well regions 210 located on the opposite side of the isolation structure 204 to the second well region portions 208-1 and 208-3 of the second well region 208 serve as the cathode region 232 of the semiconductor device 500, for example, a Schottky barrier diode. In other words, the portion of the first deep well region 206 and the above third well region 210 located between the boundary 206E of the first deep well region 206 and the second well region portions 208-1 and 208-3 of the second well region 208 serve as the cathode region 232 of the semiconductor device 500, for example, a Schottky barrier diode. In some embodiments, the anode region 230 of the semiconductor device 500 includes the discontinuous portions 220-1 and 220-2 of the implantation region 218. In other words, portions of the anode region 230 of the semiconductor device 500 do not have the implantation region 218.

Figure 3:
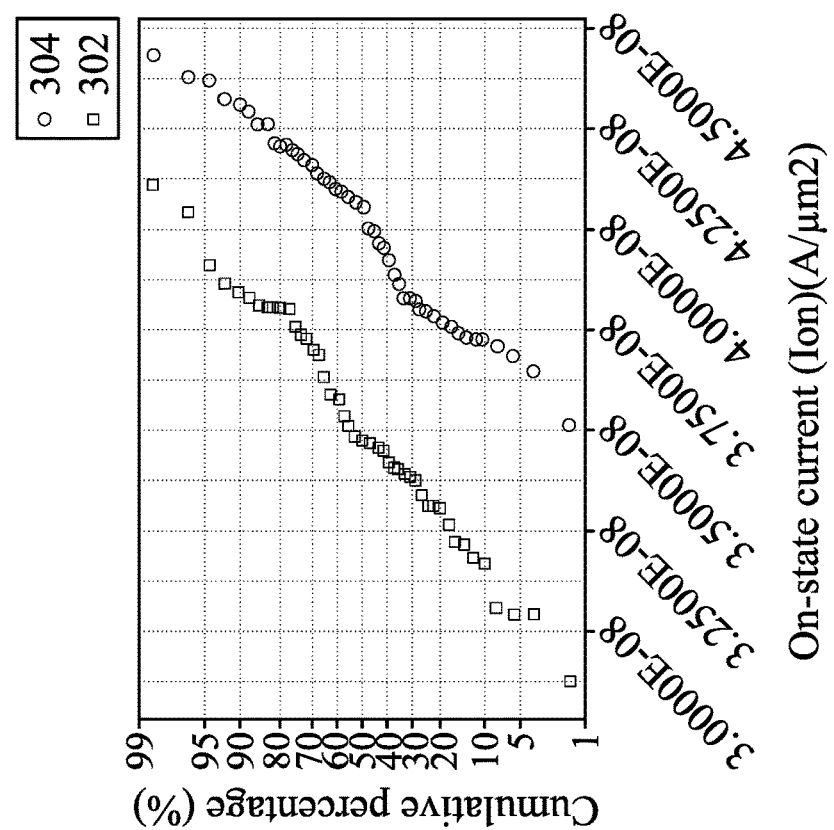
FIG. 3 is a cumulative percentage graph showing a comparison between the on-state current of a semiconductor device in accordance with some embodiments of the disclosure and the on-state current of the conventional Schottky barrier diode.

FIG. 3 is a cumulative percentage distribution of the on-state current of the semiconductor device in accordance with some embodiments of the disclosure and the on-state current of the Schottky barrier diode in a comparative example. A group of data points 302 in FIG. 3 represents the on-state current of the comparative example (the implantation region fully covers the anode region), and a group of data points 304 represents the on-state current of the semiconductor device 500 (the implantation region has discontinuous portions) in accordance with some embodiments of the disclosure, for example, a Schottky barrier diode. It can be seen from FIG. 3 that, compared with the Schottky barrier diode of the comparative example, a portion of the first deep well region 206 of the semiconductor device 500 in accordance with some embodiments of the disclosure for the on-state current flowing through has no implantation region within (or the first deep well region 206 only has a portion of the implantation region within). The resistance (i.e., Schottky barrier height) of the portions of the anode region can be reduced, thereby significantly increasing the on-state current of the semiconductor device 500.

Figure 4:
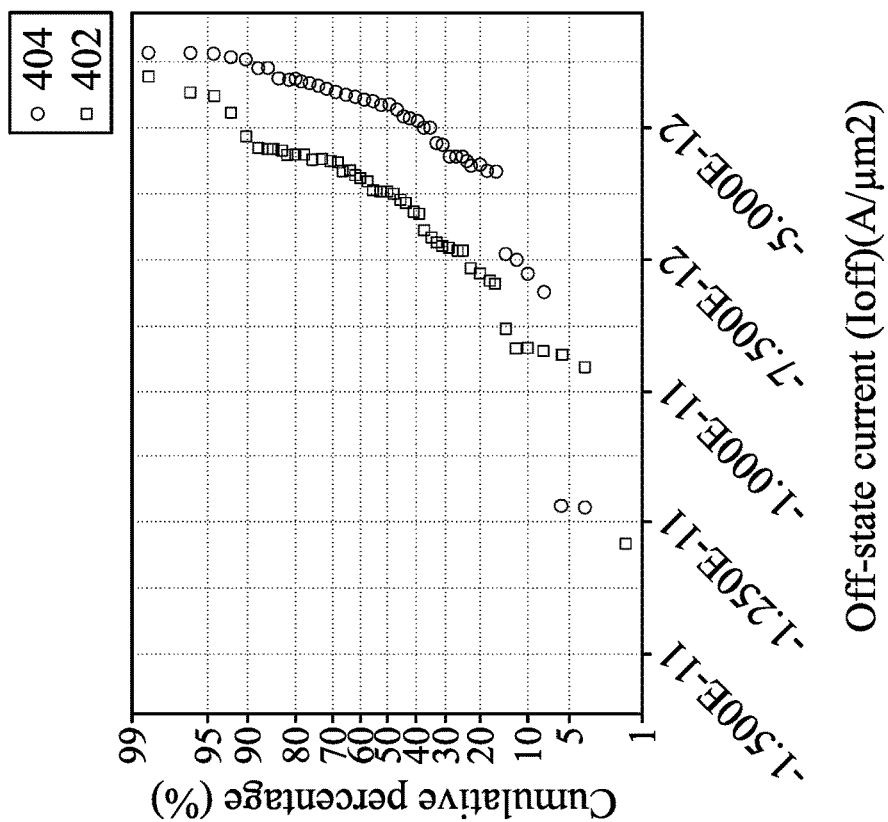
FIG. 4 is a cumulative percentage graph showing a comparison between the off-state current of a semiconductor device in accordance with some embodiments of the disclosure and a conventional Schottky barrier diode.

FIG. 4 is a cumulative percentage distribution of the off-state current (leakage) of the semiconductor device in accordance with some embodiments of the disclosure and the off-state current of the Schottky barrier diode in a comparative example. A group of data points 402 in FIG. 4 represents the off-state current of the comparative example (the implantation region fully covers the anode region). A group of data points 404 represents the off-state current of the semiconductor device 500 (the implantation region has discontinuous portions) in accordance with some embodiments of the disclosure, for example, a Schottky barrier diode. It can be seen from FIG. 4 that, compared with the Schottky barrier diode of the comparative example, the second well region 208 of the semiconductor device 500 in accordance with some embodiments of the disclosure for the off-state current (leakage) flowing through still has the implantation region within, thus the off-state current of the semiconductor device 500 is relatively lower than that of the comparative example.

Embodiments of the present invention provide a semiconductor device, such as a Schottky barrier diode. The semiconductor device includes an implantation region covering a portion of the anode region. In addition, the implantation region is located only in the second-type well region for clamping off-state current (leakage), so as to form an amorphous semiconductor material region with higher resistance therein. The amorphous semiconductor material region can increases the Schottky energy barrier and reduces the leakage current of the semiconductor device 500 in the off-state. In the semiconductor device, the portion of the first-type deep well region that conducts on-state current does not have any implantation region within, which can reduce the negative impact on the on-state current. Therefore, the semiconductor device in accordance with some embodiments of the disclosure can simultaneously improve the problem of the off-state leakage current and avoid the reduction of the on-state current of the Schottky barrier diode.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a semiconductor substrate;
   a first deep well region disposed in the semiconductor substrate, wherein the first deep well region has a first conductivity type;
   at least two second well regions disposed on the first deep well region, wherein the second well regions have a second conductivity type;
   at least one isolation structure covering a portion of the first deep well region and surrounding at least a portion of the second well regions, wherein the second well regions partially overlap the adjacent isolation structure; and
   an implantation region located under a top surface of the semiconductor substrate, wherein the implantation region has a discontinuous portion, and the discontinuous portion partially overlaps the first deep well region, and wherein the implantation region covers the at least two second wells, and the implantation region is an amorphous semiconductor material region.

2. The semiconductor device as claimed in claim 1, wherein the discontinuous portion of the implantation region is located in the first deep well region between the second well regions.

3. The semiconductor device as claimed in claim 1, wherein the second well regions surround the discontinuous portion of the implantation region.

4. The semiconductor device as claimed in claim 1, wherein the discontinuous portion of the implantation region fully overlaps a portion of the first deep well region surrounded by the second well regions.

5. The semiconductor device as claimed in claim 1, wherein the discontinuous portion of the implantation region does not overlap the second well regions at all.

6. The semiconductor device as claimed in claim 1, wherein a bottom surface of the implantation region is above a bottom surface of the isolation structure.

7. The semiconductor device as claimed in claim 1, wherein the implantation region extends in the isolation structure.

8. The semiconductor device as claimed in claim 1, further comprising:
   a gate structure disposed on the semiconductor substrate in the first deep well region, and extending to cover the isolation structure and one of the adjacent second well regions.

9. The semiconductor device as claimed in claim 8, wherein the gate structure surrounds the second well regions.

10. The semiconductor device as claimed in claim 8, further comprising:
    a conductive feature disposed on the semiconductor substrate and in contact with the second well regions and the first deep well region between the second well regions.

11. The semiconductor device as claimed in claim 10, wherein the conductive feature is in contact with the discontinuous portion of the implantation region.

12. The semiconductor device as claimed in claim 10, wherein the conductive feature is electrically connected to the gate structure.

13. The semiconductor device as claimed in claim 10, wherein the second well regions and a portion of the first deep well region between the second well regions serve as an anode region of a Schottky barrier diode, and another portion of the first deep well region on an opposite side of the isolation structure to the second well regions serve as a cathode region of the Schottky barrier diode.

14. The semiconductor device as claimed in claim 13, wherein the anode region of the Schottky barrier diode comprises the discontinuous portion of the implantation region.

15. The semiconductor device as claimed in claim 1, wherein the implantation region comprises argon ions, silicon ions, germanium ions, fluoride ions, nitrogen ions, selenium ions, sulfide ions, or a combination thereof.

16. The semiconductor device as claimed in claim 1, wherein the second well regions are shaped like a ring in a top view.

17. The semiconductor device as claimed in claim 1, wherein the implantation region has a shape of a ring and overlaps the second well in a top view.

18. The semiconductor device as claimed in claim 1, wherein a boundary of the first deep well region surrounds the second well regions in a top view.

19. The semiconductor device as claimed in claim 1, wherein a bottom surface of the first deep well region and bottom surfaces of the second well regions are located below a bottom surface of the isolation structure.

* * * * *